US009455177B1

(12) United States Patent
Park et al.

(10) Patent No.: US 9,455,177 B1
(45) Date of Patent: Sep. 27, 2016

(54) CONTACT HOLE FORMATION METHODS

(71) Applicants: Rohm and Haas Electronic Materials LLC, Marlborough, MA (US); Dow Global Technologies LLC, Midland, MI (US)

(72) Inventors: Jong Keun Park, Shrewsbury, MA (US); Phillip D. Hustad, Natick, MA (US)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/840,941

(22) Filed: Aug. 31, 2015

(51) Int. Cl.
*H01L 21/768* (2006.01)
*H01L 21/033* (2006.01)
*H01L 21/02* (2006.01)

(52) U.S. Cl.
CPC ... *H01L 21/76816* (2013.01); *H01L 21/02282* (2013.01); *H01L 21/0338* (2013.01); *H01L 21/76814* (2013.01); *H01L 21/76828* (2013.01); *H01L 21/76829* (2013.01); *H01L 21/76885* (2013.01)

(58) Field of Classification Search
CPC .......... H01L 21/76828; H01L 21/76814; H01L 21/76829; H01L 21/02282; H01L 21/0338; H01L 21/76816
See application file for complete search history.

(56) References Cited

U.S. PATENT DOCUMENTS

| 8,309,463 | B2 | 11/2012 | Lee | |
|---|---|---|---|---|
| 8,802,551 | B1 | 8/2014 | Seo et al. | |
| 9,034,765 | B2* | 5/2015 | Park | H01L 21/302 438/702 |
| 2007/0099431 | A1* | 5/2007 | Li | H01L 21/3081 438/735 |
| 2008/0081461 | A1* | 4/2008 | Lee | H01L 21/0337 438/637 |
| 2009/0068838 | A1* | 3/2009 | Kim | H01L 21/0337 438/692 |
| 2009/0317748 | A1* | 12/2009 | Choi | G03F 7/095 430/312 |
| 2011/0124196 | A1* | 5/2011 | Lee | H01L 21/0337 438/696 |
| 2012/0223433 | A1* | 9/2012 | Jee | H01L 24/16 257/772 |
| 2012/0252168 | A1* | 10/2012 | Nah | H01L 21/563 438/124 |
| 2013/0214890 | A1* | 8/2013 | Zabaco | H01F 17/0013 336/200 |
| 2013/0320569 | A1* | 12/2013 | Aoki | H01L 23/562 257/777 |
| 2015/0115440 | A1* | 4/2015 | Higuchi | H01L 24/05 257/737 |
| 2015/0179467 | A1* | 6/2015 | Brown | H01L 21/3088 438/703 |
| 2015/0200165 | A1* | 7/2015 | Shiba | H01L 21/3086 438/401 |
| 2016/0187783 | A1* | 6/2016 | Kaur | G03F 7/42 430/312 |

* cited by examiner

Primary Examiner — Joseph C Nicely
(74) Attorney, Agent, or Firm — Jonathan D. Baskin

(57) ABSTRACT

Methods of forming contact holes comprising: (a) providing a substrate comprising a plurality of post patterns over a layer to be patterned; (b) forming a hardmask layer over the post patterns and the layer to be patterned; (c) coating a pattern treatment composition over the hardmask layer, wherein the pattern treatment composition comprises a polymer comprising a reactive surface attachment group and a solvent; and optionally baking the substrate; wherein the polymer becomes bonded to the hardmask layer to form a polymer layer over the hardmask layer; and (d) treating the substrate with a rinsing agent comprising a solvent to remove residual, unbound said polymer, thereby forming a first hole disposed between a plurality of surrounding post patterns. The method is free of exposing the polymer to activating radiation from coating the pattern treatment composition to treating the substrate with the solvent. Also provided are pattern treatment compositions and electronic devices formed by the methods. The inventions find particular applicability in the manufacture of semiconductor devices for providing high resolution contact hole patterns.

10 Claims, 8 Drawing Sheets

A-A

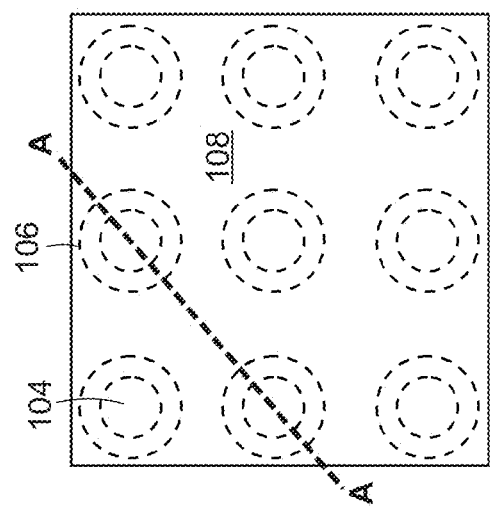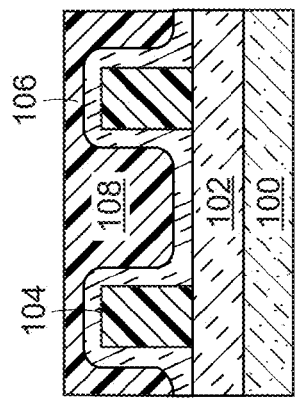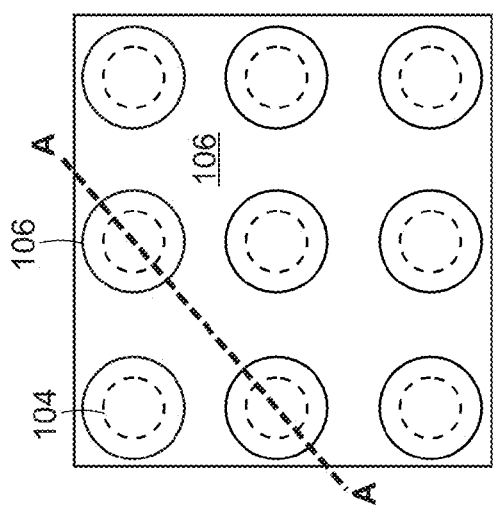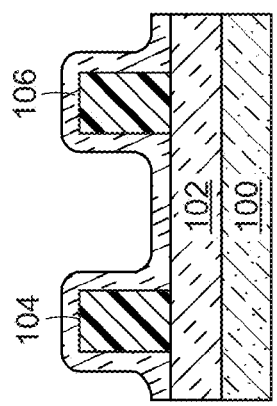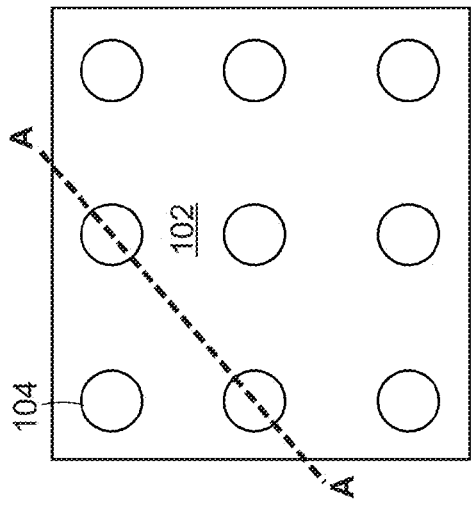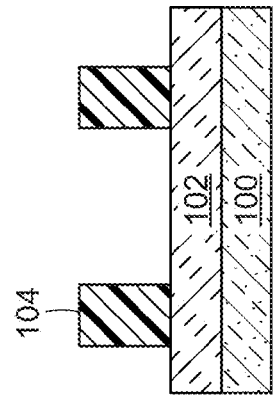
FIG. 2A  FIG. 2B  FIG. 2C

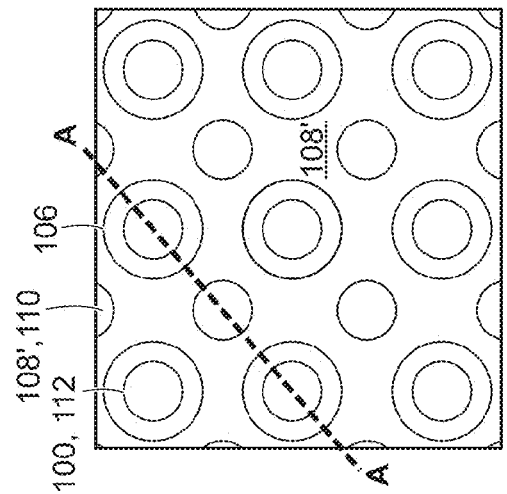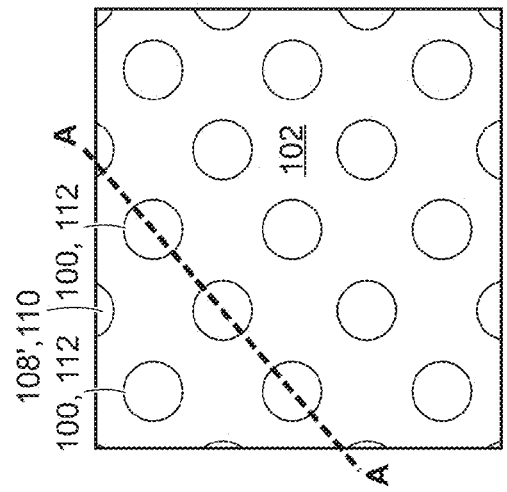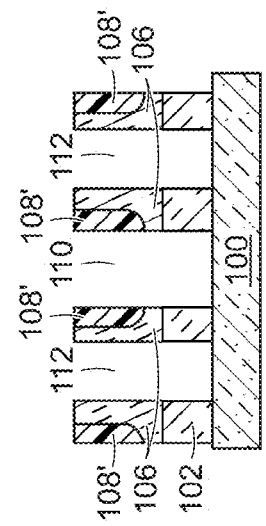
FIG. 2G
FIG. 2H

| Pattern Treatment Composition | NA | PTC-1 | PTC-2 | PTC-3 | PTC-4 |
|---|---|---|---|---|---|
| Mask CD = 56 nm / 100 nm pitch | | | | | |
| Mask CD = 58 nm / 100 nm pitch | | | | | |
| Process | After SiN Coating | After PTC Rinse | After PTC Rinse | After PTC Rinse | After PTC Rinse |
| Rinse Solvent | NA | PGMEA | PGMEA | PGMEA | NBA |

FIG. 4

CONTACT HOLE FORMATION METHODS

FIELD OF THE INVENTION

The invention relates generally to the manufacture of electronic devices. More specifically, this invention relates to contact hole formation methods which allow for the formation of dense contact hole patterns. The invention also relates to pattern treatment compositions useful in and electronic devices formed by the methods. The invention finds particular applicability in the manufacture of semiconductor devices for providing high resolution contact hole patterns.

BACKGROUND OF THE INVENTION

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed. To improve lithographic performance, 193 nm immersion lithography tools have been developed to effectively increase the numerical aperture (NA) of the lens of the imaging device, for example, a scanner having an ArF light source. This is accomplished by use of a relatively high refractive index fluid (i.e., an immersion fluid) between the last surface of the imaging device and the upper surface of the semiconductor wafer. The resolution limit of 193 nm immersion scanners, however, does not allow for direct patterning of certain features at the resolutions needed in next generation semiconductor devices. To increase imaging resolution over that obtainable with 193 immersion scanners, EUV exposure tools have been developed. The widespread adoption of these tools has, however, been delayed due, for example, to technical issues surrounding the EUV light source and their prohibitively high cost. Accordingly, it would be desirable to extend the capabilities of existing lithographic toolsets through new process integration schemes.

A double patterning process has been proposed for the printing of high density contact hole arrays. In this process, separate exposure steps using different photomasks are used to image a first contact hole pattern and then a second contact hole pattern offset from the first pattern. This method, however, is highly sensitive to overlay error in that precise alignment of the second contact hole mask pattern for the second exposure to the first exposure contact hole pattern is required.

To avoid the potential for alignment error, a self-aligned contact hole formation method has been proposed. With reference to FIG. 1, U.S. Pat. No. 8,309,463 B2 discloses formation of a spacer layer 1 on sidewalls of photoresist pillar patterns 2 disposed in a square array such that adjacent spacers come into contact with each other, removing the photoresist patterns, etching an underlying mask layer 3 using the spacer as an etch mask to form a mask pattern and etching an underlying target etching layer using the mask pattern as an etch mask to form a target contact hole. Contact holes are formed in the regions 4 between (external to) the spacers and in the regions within the spacers. The spacer layer can be a nitride film, an oxide film or a combination thereof, and can be formed by atomic layer deposition (ALD). This process is disadvantageous in that the regions formed between the spacers are not round, but rather have an astroid shape in which a cusp 5 is formed at the contact point of each set of adjacent spacers. It is believed that this pattern would be transferred to the mask layer and target contact hole after etching. As a result of the pattern's non-circular geometry and cusps, it is believed that electrical characteristics of the resulting devices would be detrimentally affected. In addition, differences in size and geometry of contact holes formed from the regions between the spacers with respect to the surrounding holes formed from the regions within the spacers can result in a bimodal distribution of conductivity, which can also adversely impact device performance. The described process is also disadvantageous in that non-square contact hole arrays can exacerbate the problems described above. For example, in the case of an oblong rectangular contact hole array, the resulting contact holes formed between pillar patterns would themselves be oblong as well as having cusps, making those holes differ in size and geometry from the circular holes formed from the regions within the spacers. A hexagonal contact hole array would result in a deltoid-shaped region with three cusps between each group of three surrounding pillars, and would suffer from the same problems described above with respect to the square array.

There is a continuing need in the art for improved pattern forming methods which address one or more problems associated with the state of the art and which allow for the formation of high-density contact hole patterns in electronic device fabrication.

SUMMARY

In accordance with one aspect of the invention, methods of forming contact holes are provided. The methods comprise: (a) providing a substrate comprising a plurality of post patterns over a layer to be patterned; (b) forming a hardmask layer over the post patterns and the layer to be patterned; (c) coating a pattern treatment composition over the hardmask layer, wherein the pattern treatment composition comprises a polymer comprising a reactive surface attachment group and a solvent; and optionally baking the substrate; wherein the polymer becomes bonded to the hardmask layer to form a polymer layer over the hardmask layer; and (d) treating the substrate with a rinsing agent comprising a solvent to remove residual, unbound said polymer, thereby forming a first hole disposed between a plurality of surrounding post patterns. The method is free of exposing the polymer to activating radiation from coating the pattern treatment composition to treating the substrate with the solvent. Also provided are pattern treatment compositions and electronic devices formed by the methods.

The terminology used herein is for the purpose of describing particular embodiments only and is not intended to be limiting of the invention. As used herein, the singular forms "a", "an" and "the" are intended to include both singular and plural forms, unless the context clearly indicates otherwise.

BRIEF DESCRIPTION OF THE DRAWINGS

The present invention will be described with reference to the following drawings, in which like reference numerals denote like features, and in which:

FIG. 2A-H depicts cross-sectional and top-down views of a first electronic device substrate at various stages of a contact hole formation method in accordance with the invention;

FIG. 4 provides SEM photomicrographs of contact holes formed in the Examples.

DETAILED DESCRIPTION

Figure 1:
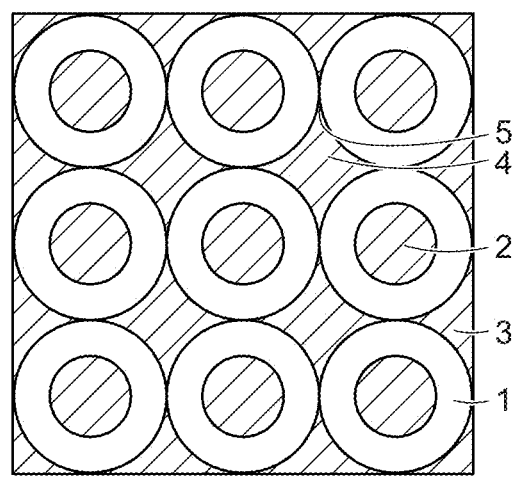
FIG. 1 depicts a top-down view of an electronic device substrate in a known contact hole patterning process.

Methods in accordance with the invention will now be described with reference to FIG. 2A-H, which illustrates an exemplary process flow for the formation of contact holes.

FIG. 2A depicts top-down and cross-sectional views (top diagram and bottom diagram, respectively) of a substrate 100 having one or more layer to be patterned 102 on a surface thereof and a plurality of post patterns 104 over layer 102. The cross-sectional views are taken along dashed line A-A in the respective top-down view. The substrate can include various layers and features formed on a surface thereof. The substrate can be of a material such as a semiconductor, for example, silicon or a compound semiconductor (e.g., III-V or II-VI), glass, quartz, ceramic, copper and the like. Typically, the substrate is a semiconductor wafer.

The one or more layer to be patterned 102 may include, for example, one or more of conductive layers such as layers of aluminum, copper, molybdenum, tantalum, titanium, tungsten, alloys, nitrides or silicides of such metals, doped amorphous silicon or doped polysilicon layers, dielectric layers such as layers of silicon oxide, silicon nitride, silicon oxynitride, or metal oxides, and semiconductor layers. Depending on the particular layers to be etched, film thicknesses and photolithographic materials and process to be used, layer 102 can include a hard mask layer and/or a bottom antireflective coating (BARC) layer, over which a photoresist layer can be coated and a post pattern 104 formed.

Use of a hard mask layer may be desired, for example, with very thin resist layers, where the layers to be etched require a significant etching depth, and/or where the particular etchant has poor resist selectivity. The post patterns to be formed can be transferred to the hard mask layer which, in turn, can be used as a mask for etching one or more underlying layer. Suitable hard mask materials and formation methods are known in the art. Typical materials include, for example, tungsten, titanium, titanium nitride, titanium oxide, zirconium oxide, aluminum oxide, aluminum oxynitride, hafnium oxide, spin-on-carbon (SOC), silicon oxynitride and silicon nitride. The hard mask layer can include a single layer or a plurality of layers of different materials. The hard mask layer can be applied, for example, by chemical vapor deposition (CVD), physical vapor deposition (PVD) or spin-coating.

A BARC layer may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers, and can be of an organic or inorganic material. Suitable antireflective materials and methods of formation are known in the art. Antireflective materials are commercially available, for example, those sold under the AR™ trademark by Rohm and Haas Electronic Materials LLC (Marlborough, Mass. USA), such as AR™ 40A and AR™ 124 antireflectant materials.

The one or more layer to be etched 102 can be applied by various techniques, for example, one or more of CVD such as plasma-enhanced CVD (PECVD), low-pressure CVD (LPCVD) or epitaxial growth, atomic layer deposition (ALD), PVD such as sputtering or evaporation, electroplating or spin-coating. The particular thickness of the layers to be etched will vary depending on the materials and particular devices being formed.

Figure 2F:
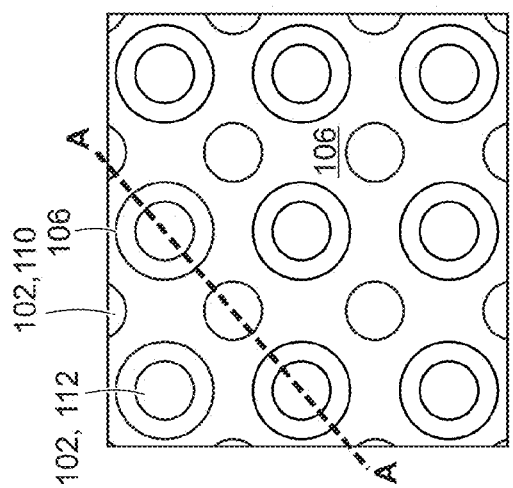
Figure 2F:
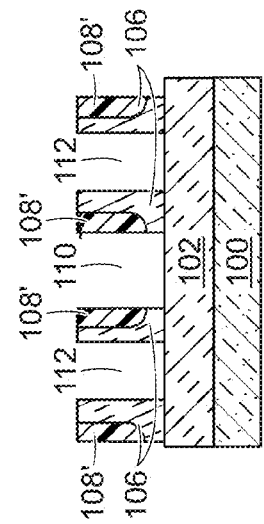
Figure 3A:
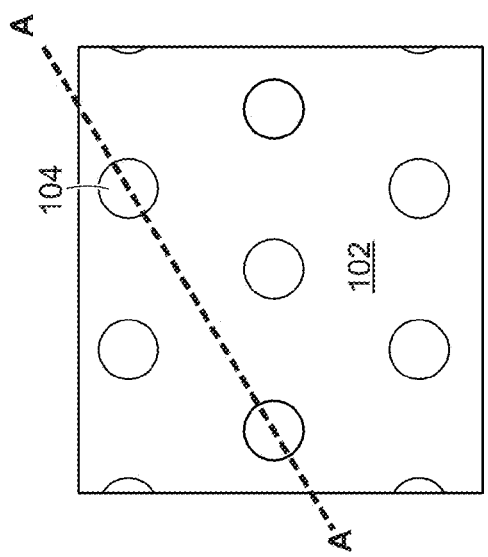
FIG. 3A-H depicts cross-sectional and top-down views of a second electronic device substrate at various stages of a contact hole formation method in accordance with the invention.
Figure 3A:
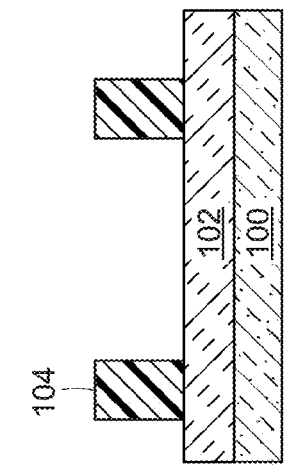
Figure 3B:
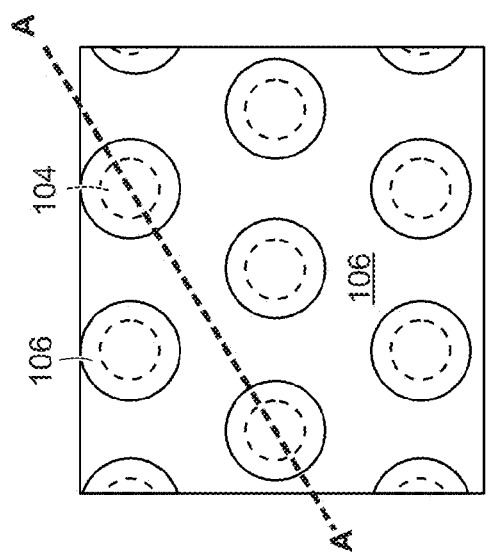
Figure 3B:
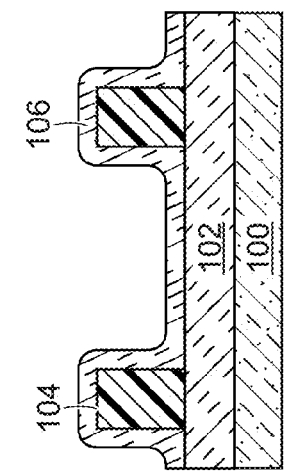
Figure 3C:
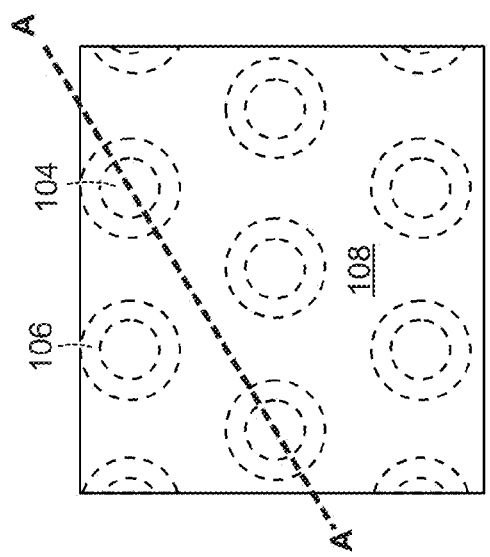
Figure 3C:
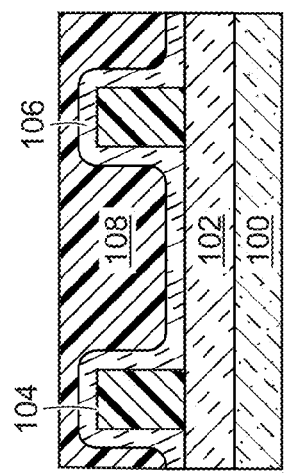
Figure 3D:
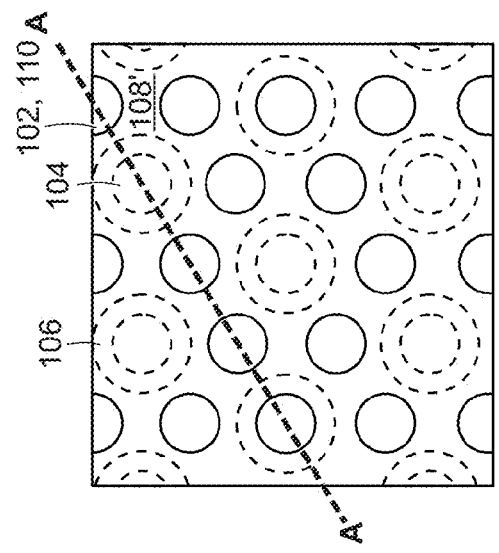
Figure 3D:
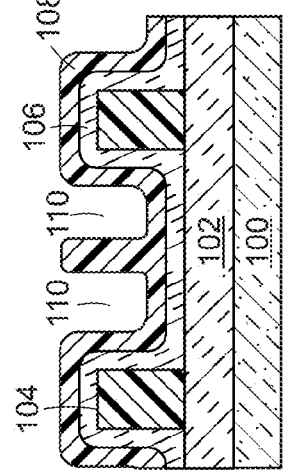
Figure 3E:
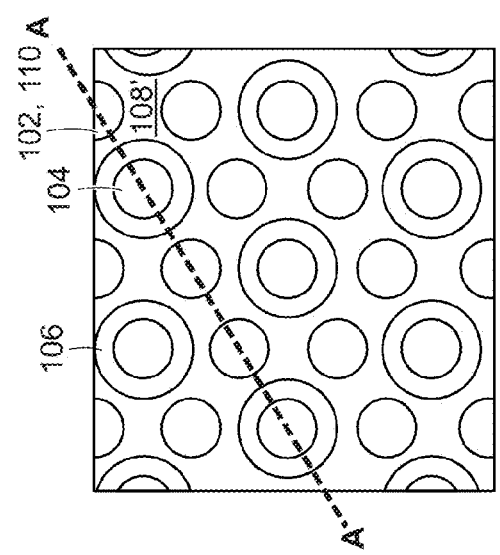
Figure 3E:
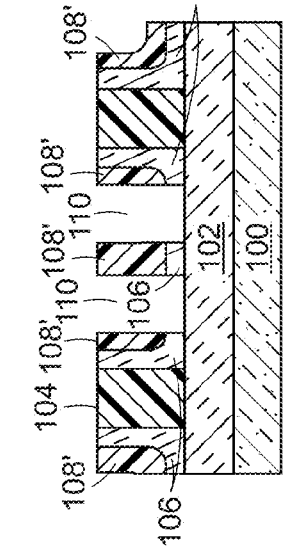
Figure 3F:
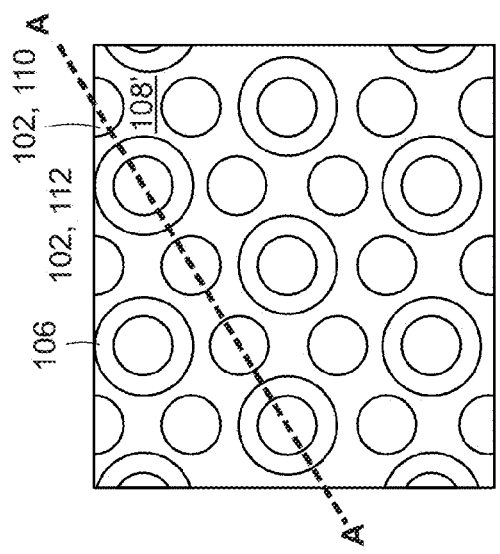
Figure 3F:
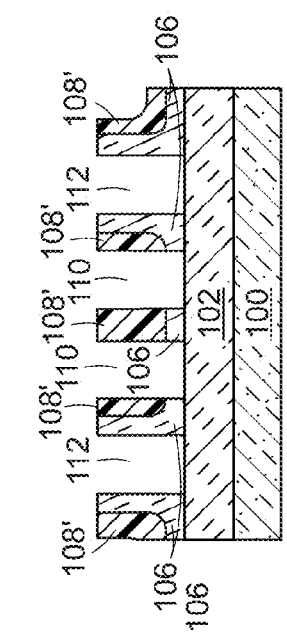
Figure 3G:
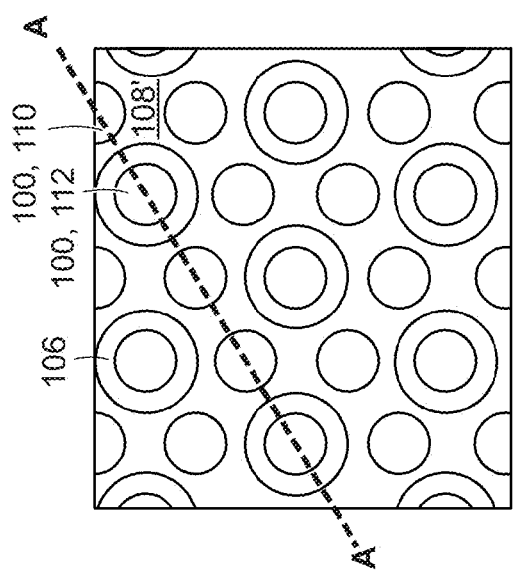
Figure 3G:
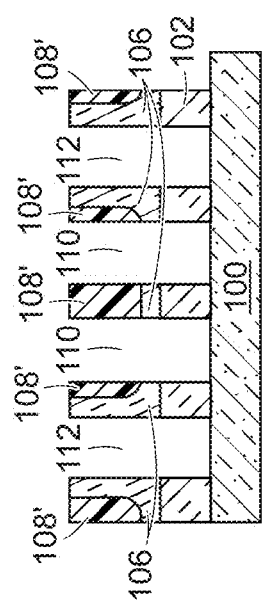
Figure 3H:
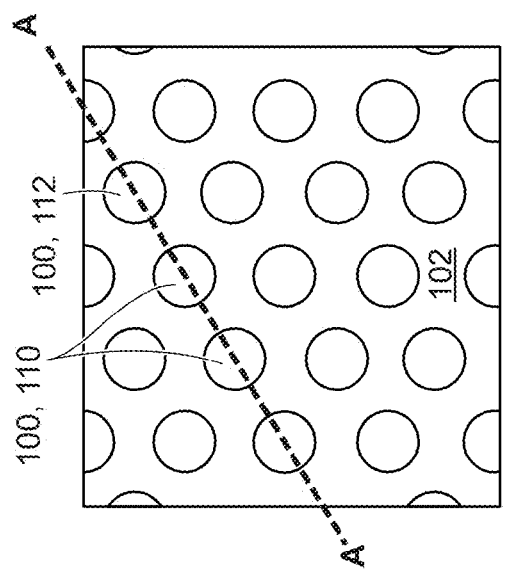
Figure 3H:
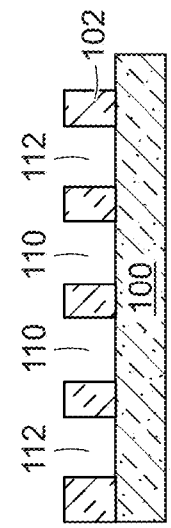

The post patterns 104 are typically cylindrical in geometry forming, for example, a circular or elliptical cylinder, but are not limited thereto. The posts typically have a height of from 500 to 2000 Å, preferably from 800 to 1200 Å, a diameter of from 200 to 700 Å, preferably from 300 to 500 Å and a pitch of from 400 to 1200 Å. The post patterns are typically disposed in an ordered array, for example, a rectangular array such as a square array as shown in FIG. 2A or a hexagonal array as shown in FIG. 3A. Other array types including rectangular oblong arrays can be used in the described methods.

The material of the post patterns and other materials used in forming the device should be selected such that the post patterns can be selectively removed later in the process, as described below. Preferably, the post patterns are formed from an organic material, for example an organic photoresist or SOC layer. The post patterns 104 can be formed by various techniques. For example, the posts can be directly patterned using photolithography by exposing a photoresist layer to activating radiation through a photomask having post patterns, post-exposure baking and development. Activating radiation indicates that the radiation is capable of forming a latent image in the photoresist composition. A positive-type or negative-type photoresist material can be used, with such materials being known in the art. The exposure wavelength is typically 248 nm, 193 nm or an EUV wavelength (e.g., 13.4-13.5 nm), with 193 nm immersion lithography being preferred. To provide improved pattern resolution, it may be desirable to employ a negative tone development (NTD) method for patterning the photoresist. In the NTD method, the polarity of the matrix polymer is altered in exposed regions of the photoresist layer by cleavage of acid labile leaving groups such that the exposed regions become insoluble in an organic solvent developer and remain after development to form the resist pattern, while unexposed regions are removed by the developer. The NTD developer is typically a solvent chosen from ketones, esters, ethers, hydrocarbons, and mixtures thereof, with 2-heptanone or a butyl acetate such as n-butyl acetate being typical. Optionally, the post patterns 104 can be formed by transferring a photoresist post pattern, formed as described above, to an underlayer, preferably, an organic underlayer such as an SOC layer. Pattern transfer to such an underlayer can be conducted, for example, by known anisotropic dry etching techniques.

With reference to FIG. 2B, a hardmask layer 106 is applied to the substrate over the post patterns 104 and layers to be patterned 102. The hardmask material should be a material with which the polymer of the pattern treatment composition to be applied can form a bond, for example, a hydrogen bond or a covalent bond. Suitable hardmask materials are known in the art and include those hardmask materials and application techniques described above, for example, silicon oxide, silicon nitride, silicon oxynitride, tungsten, titanium, titanium nitride, titanium oxide, zirconium oxide, aluminum oxide, aluminum oxynitride, hafnium oxide and SOC. Of these, silicon oxide, silicon nitride and silicon oxynitride are typical. The particular material used for the hardmask layer should be chosen to allow selective removal of the post pattern material later in the process without appreciable removal of the hardmask layer. The thickness of the hardmask layer is typically from 10 to 50 nm, for example, from 20 to 40 nm. The thickness of the hardmask material can be selected such that adjacent hardmask-coated post patterns are separated from each other as shown in FIG. 2B or, alternatively, are in contact with each other.

With reference to FIG. 2C, a pattern treatment composition is coated over the hardmask material layer 106 to form a pattern treatment composition layer 108. The pattern treatment composition includes one or more polymer having a reactive surface attachment group and a solvent, and may include one or more additional, optional components.

Suitable polymers include, for example, those that can become bonded to (i.e., grafted) to the surface of the hardmask material layer through the reactive surface attachment group to form a layer over the hardmask material layer. The layer is typically formed by hydrogen or covalent bonding of the polymer to the surface of the hardmask material layer.

Suitable polymers include homopolymers and copolymers including random copolymers and block copolymers (BCPs). The random copolymers can include two, three, four or more units. The block copolymers can be multiblock copolymers. The multiblocks can include, for example, diblocks, triblocks, tetrablocks, or more blocks, wherein one or more block can include a random copolymer. The blocks can be part of a linear copolymer, a branched copolymer where the branches are grafted onto a backbone (these copolymers are also sometimes called "comb copolymers"), a star copolymer, and the like.

Suitable polymers include, for example: hybrid organic-inorganic silicon-containing polymers including organic polysiloxanes such as optionally substituted poly(dimethylsiloxane) (PDMS) and organosilanes such as poly(trimethyl [4-vinylphenyl)silane; organic polymers such as optionally substituted polystyrene (PS), poly(methylmethacrylate) (PMMA), poly(phenylmethacrylate), poly(2-vinylpyridine) (P2VP), poly(4-vinylpyridine) (P4VP), poly(arylene oxides), polyethylene, polypropylene, hydrogenated polybutadiene, polycyclohexylethylene, block copolymers of styrene and butadiene or isoprene such as polystyrene-block-polybutadiene and polystyrene-block-polybutadiene-block-polystyrene, partially hydrogenated block copolymers of styrene and butadiene or isoprene such as polystyrene-block-poly(ethylene-ran-butylene) and polystyrene-block-poly(ethylene-ran-butylene)-block-polystyrene, fully hydrogenated block copolymers of styrene and butadiene or isoprene such as poly(cyclohexylethylene)-block-poly(ethylene-ran-butylene) and poly(cyclohexylethylene)-block-poly(ethylene-ran-butylene)-block-poly(cyclohexylethylene), alternating copolymer of styrene and maleic anhydride or maleimide such as poly(styrene-alt-maleic anhydride) and poly(styrene-alt-maleimide), block copolymers of styrene and 2-vinylpyridine such as poly(styrene-block-2-vinlpyridine), block copolymers of styrene and 4-vinylpyridine such as poly(styrene-block-4-vinlpyridine); and combinations of any of the foregoing as a random or block copolymer. Such polymers can be optionally substituted, for example, with one or more substituent such as a halogen (i.e., F, Cl, Br, I), hydroxyl, amino, thiol, carboxyl, carboxylate, ether (—O—), ester, amide, nitrile, sulfide, disulfide, nitro, $C_{1-18}$ alkyl, $C_{1-18}$ alkenyl (including norbornenyl), $C_{1-18}$ alkoxyl, $C_{2-18}$ alkenoxyl, $C_{5-18}$ aryl, $C_{5-18}$ aryloxyl, $C_{6-18}$ alkylaryl, $C_{6-18}$ alkylaryloxyl, or with a reactive surface attachment group as described herein. Selection of a suitable polymer will depend, for example, on desired etch selectivity with respect to other materials used in the process, target thickness and solubility in the formulation, edge bead remover and rinse solvent.

The polymer comprises a reactive surface attachment group for forming a bond, typically hydrogen bond or a covalent bond, with the hardmask layer. The reactive surface attachment group can be present, for example, as an end-group or as a group pendant to the polymer backbone such as in one or more repeat unit of the polymer. The particular site on the hardmask layer with which the reactive surface attachment group will depend on the material of the hardmask layer. For example, in the case of a silicon oxide, silicon nitride or silicon oxynitride hardmask layer, the reactive surface attachment group can be suitable for reacting with silanol along exposed surfaces of the hardmask layer to form a bond. Suitable reactive surface attachment groups include, for example, one or more group chosen from: hydroxyl; sulfhydryl; carboxyl; epoxide; amine, for example, primary amines such as N-methylamine, N-ethylamine, 1-aminopropane, 2-aminopropane and N-t-butylamine, secondary amines such as dimethylamine, methylethylamine and diethylamine, and tertiary amines such as trimethylamine; amide, for example, alkylamides such as N-methylamide, N-ethylamide, N-phenylamide and N,N-dimethylamide; imine, for example, primary and secondary aldimines and ketimines; diazine, for example optionally substituted pyrazine, piperazine, phenazine; diazole, for example, optionally substituted pyrazole, thiadiazole and imidazole; optionally substituted pyridine, for example, pyridine, 2-vinylpyridine and 4-vinylpyridine; pyridinium; optionally substituted pyrrolidone, for example, 2-pyrrolidone, N-vinylpyrrolidone and cyclohexyl pyrrolidine; and combinations thereof. Of these, hydroxy is preferred. The reactive surface attachment group can optionally take the form of a ring pendant to the polymer backbone, for example, pyridine, indole, imidazole, triazine, pyrrolidine, azacyclopropane, azacyclobutane, piperidine, pyrrole, purine, diazetidine, dithiazine, azocane, azonane, quinoline, carbazole, acridine, indazole and benzimidazole.

Without limitation, exemplary polymers for the pattern treatment composition include one or more of the following:

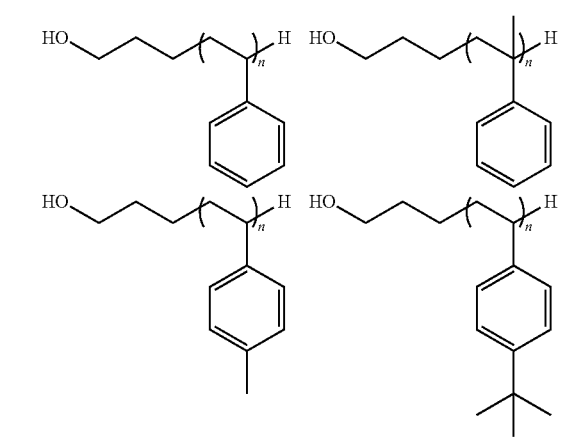

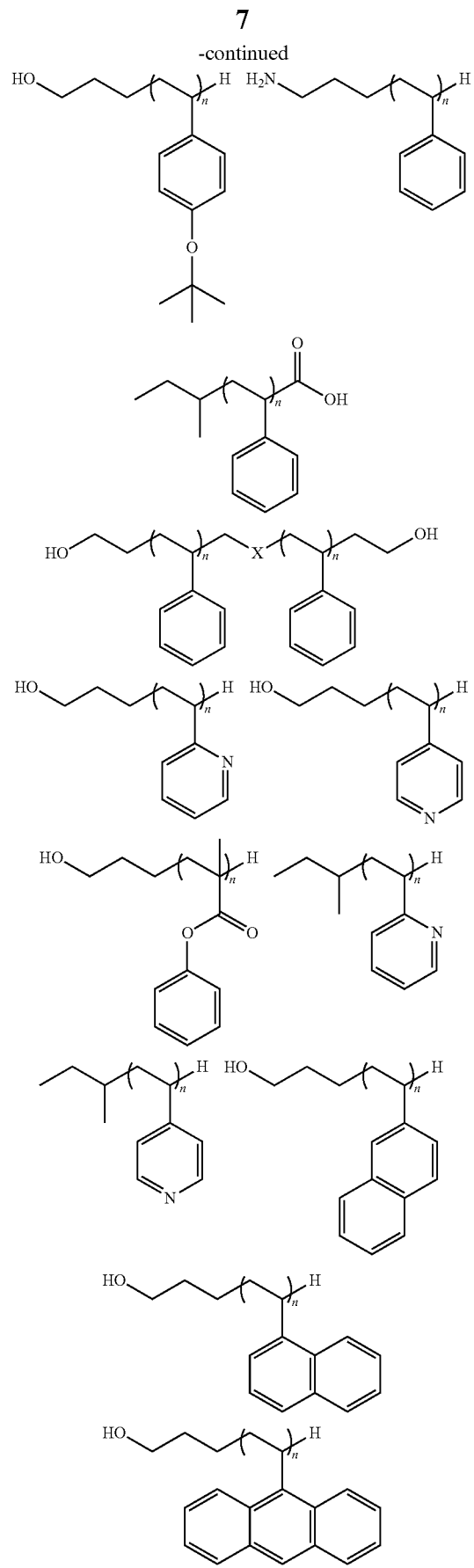

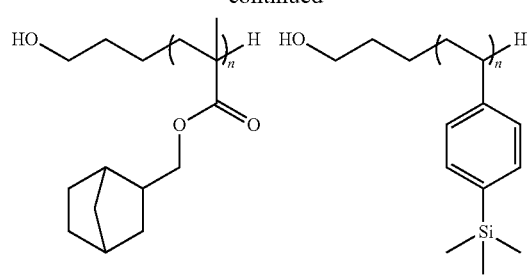
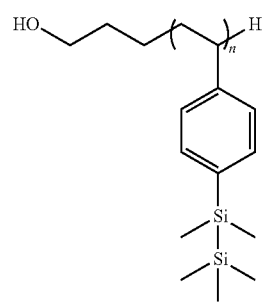
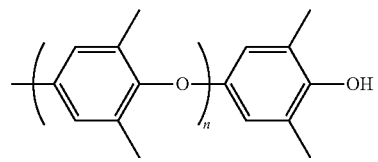
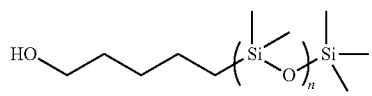
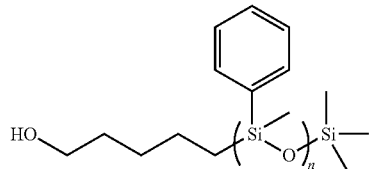
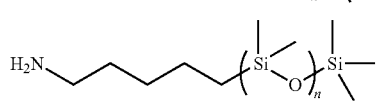
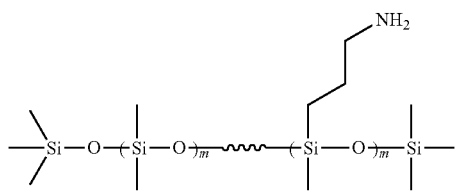
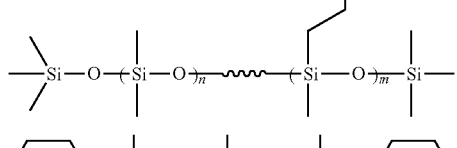
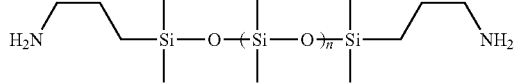
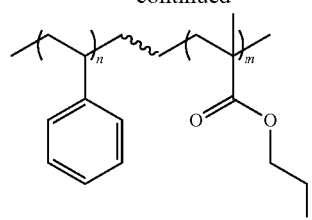
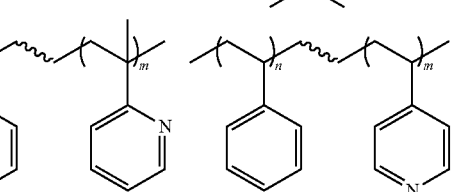
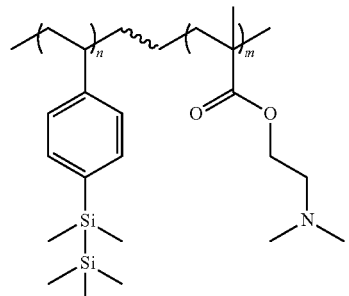
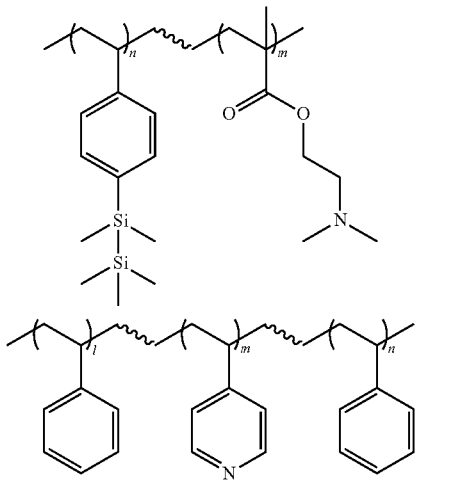
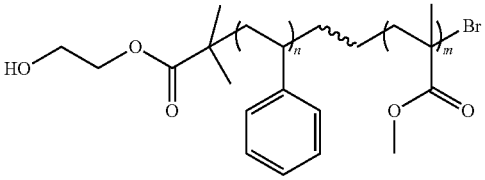
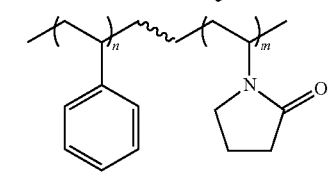
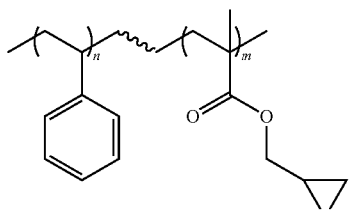
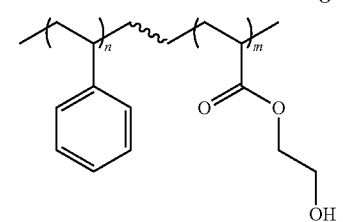

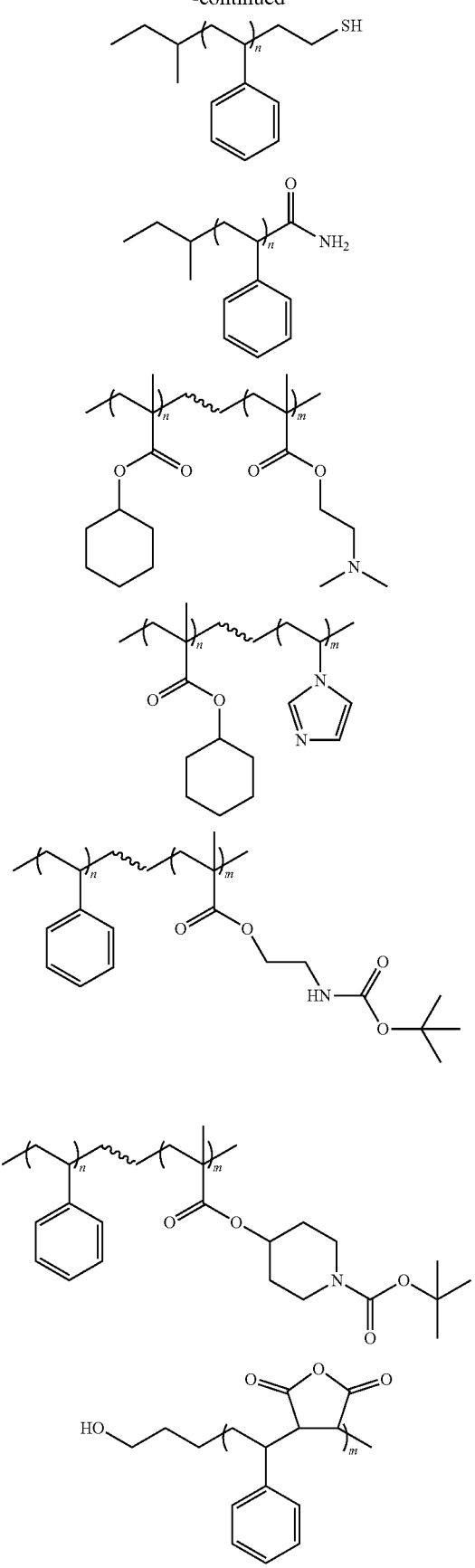
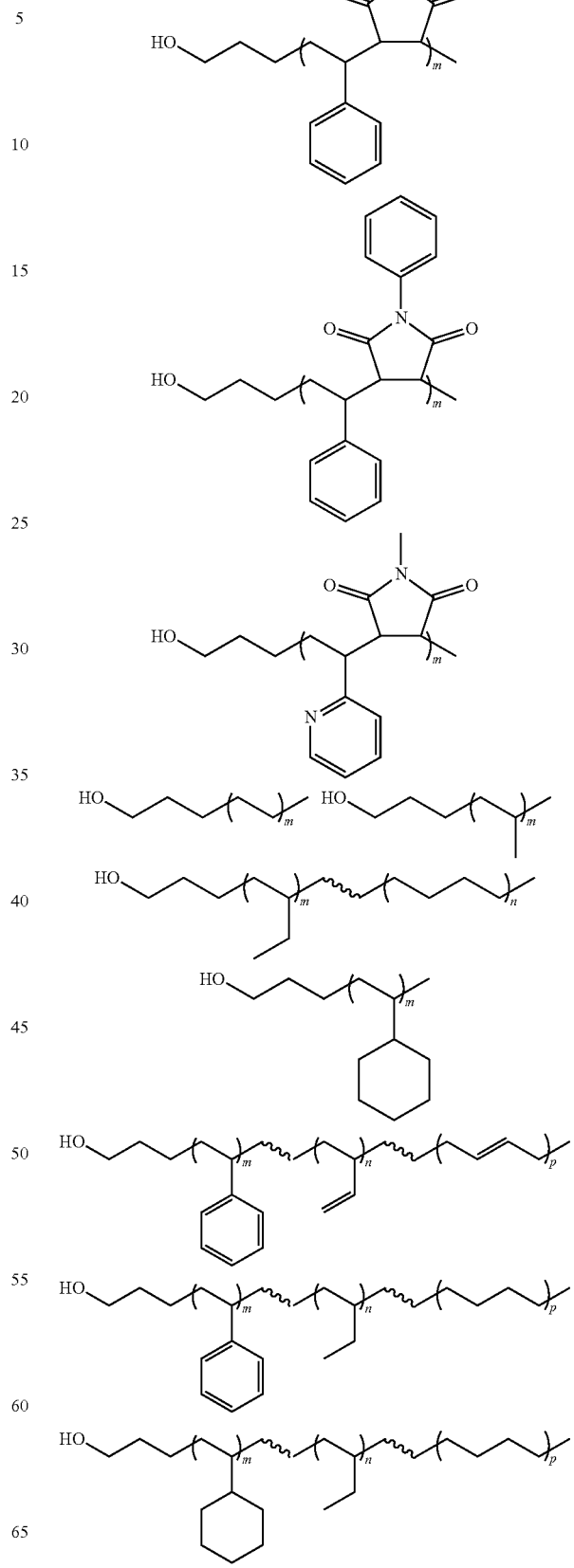

-continued

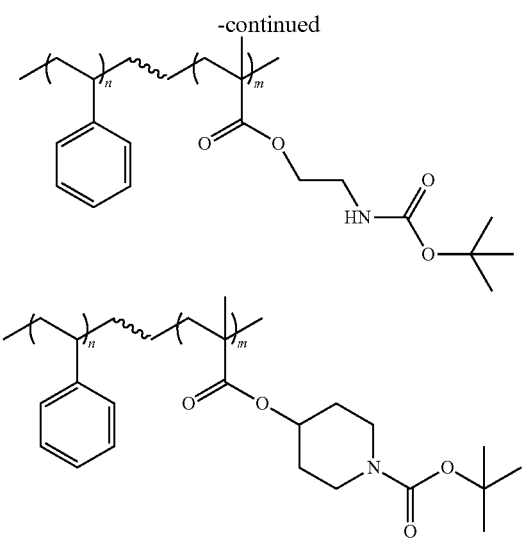

The polymer should have good solubility in the solvent used in the pattern treatment composition and in the solvent used to rinse and remove residual, ungrafted polymer (i.e., polymer not bonded to the hardmask layer) from the substrate. The content of the polymer in the pattern treatment composition will depend, for example, on the desired coating thickness of the composition. The polymer is typically present in the composition in an amount of from 50 to 100 wt %, more typically from 70 to 100 wt % or 90 to 100 wt %, based on total solids of the pattern treatment composition. The weight average molecular weight of the polymer is typically less than 400,000, preferably from 2000 to 200,000, more preferably from 2000 to 125,000 or from 10,000 to 30,000 g/mol. Suitable polymers for use in the pattern treatment compositions are commercially available and/or can readily be made by persons skilled in the art.

The pattern treatment composition further includes a solvent. Suitable solvent materials to formulate and cast the pattern treatment composition exhibits excellent solubility characteristics with respect to the non-solvent components of the composition, but do not appreciably dissolve the underlying hardmask layer. The solvent is typically chosen from organic solvents, aqueous solvents, and mixtures thereof. Suitable organic solvents for the pattern treatment composition include, for example: alkyl esters such as n-butyl acetate, n-butyl propionate, n-pentyl propionate, n-hexyl propionate and n-heptyl propionate, and alkyl butyrates such as n-butyl butyrate, isobutyl butyrate and isobutyl isobutyrate; ketones such as 2-heptanone, 2,6-dimethyl-4-heptanone and 2,5-dimethyl-4-hexanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; and alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; toluene, anisole and mixtures containing one or more of these solvents. Of these organic solvents, alkyl propionates, alkyl butyrates and ketones, preferably branched ketones, are preferred and, more preferably, $C_8$-$C_9$ alkyl propionates, $C_8$-$C_9$ alkyl propionates, $C_8$-$C_9$ ketones, and mixtures containing one or more of these solvents. Suitable mixed solvents include, for example, mixtures of an alkyl ketone and an alkyl propionate such as the alkyl ketones and alkyl propionates described above. The solvent component of the composition is typically present in an amount of from 90 to 99 wt % based on the total composition.

The pattern treatment composition can include one or more optional components such as an additional polymer as described above or an additive polymer for adjusting the thickness of the pattern treatment composition layer. Preferably, an additive thickness-adjusting polymer is not graftable to the hardmask layer, and is therefore free of substituents which are reactive with the hardmask layer. Suitable non-graftable thickness-adjusting polymers include, for example, optionally substituted PS and PMMA, provided the substituents do not render the polymers graftable to the hardmask layer. Suitable optional substituents include, for example, with one or more of halogen (i.e., F, Cl, Br, I), $C_{1-18}$ alkyl, $C_{1-18}$ alkenyl (including norbornenyl), $C_{1-18}$ alkoxyl, $C_{2-18}$ alkenoxyl, $C_{5-18}$ aryl, $C_{5-18}$ aryloxyl, $C_{6-18}$ alkylaryl, $C_{6-18}$ alkylaryloxyl, ether (—O—) and ester. The additive polymer should have good solubility in the solvent used in the pattern treatment composition and in the solvent used to rinse and remove residual, ungrafted polymer from the substrate. The content of the optional additive polymer, if present, is typically from 1 to 50 wt %, more typically from 1 to 40 wt % or 1 to 30 wt %, based on total solids of the pattern treatment composition. The weight average molecular weight of the additive polymer is typically less than 400,000, preferably from 2000 to 200,000, more preferably from 2000 to 125,000 or from 10,000 to 30,000 g/mol. Suitable additive polymers for use in the pattern treatment compositions are commercially available and/or can readily be made by persons skilled in the art.

Other optional components for the pattern treatment composition include, for example, one or more surfactant or antioxidant. Such optional additives if used are each typically present in the composition in minor amounts such as from 0.01 to 10 wt % based on total solids of the composition.

Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL and DYNOL. Additional suitable surfactants include other polymeric compounds such as the tri-block EO-PO-EO co-polymers PLURONIC 25R2, L121, L123, L31, L81, L101 and P123 (BASF, Inc.).

An antioxidant can be added to prevent or minimize oxidation of other components in the pattern treatment composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl.hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethyl-amino-p-cresol, 6-(4-hydroxy-3,5-di-tert-butyl.anilino)2,4-bis.octyl-thio-1,3,5-triazine, n-octadecyl-3-(4'-hydroxy-3', 5'-di-tert-butyl.phenyl)propionate, octylated phenol, aralkyl-substituted phenols, alkylated p-cresol and hindered phenol; bis-, tris- and poly-phenols such as 4,4'-dihydroxy-.diphenyl, methylene.bis(dimethyl-4,6-phenol), 2,2'-methyl-ene-bis-(4-methyl-6-tert-butylphenol), 2,2'-methylene-bis-(4-methyl-6-cyclohexyl.phenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl.diphenylmethane, alkylated bisphenol, hindered bisphenol, 1,3,5-trimethyl-2, 4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl) propionate]methane. Suitable antioxidants are commercially available, for example, Irganox™ antioxidants (Ciba Specialty Chemicals Corp.).

The pattern treatment composition is preferably free of crosslinkers, acids, acid generator compounds, for example, thermal acid generator compounds and photoacid generator compounds, as such compounds or their derivatives may interfere with the bonding of the polymer to the hardmask layer.

The pattern treatment compositions can be prepared following known procedures. For example, the compositions can be prepared by dissolving the polymer and other optional solid components of the composition in the solvent component. The desired total solids content of the compositions will depend on factors such as the particular polymer(s) in the composition and desired final layer thickness. Preferably, the solids content of the pattern treatment compositions is from 1 to 10 wt % based on the total weight of the composition.

The polymer can be subjected to purification prior to being combined with the other components of the pattern treatment composition for removal of metallic and/or nonmetallic impurities. Purification can involve, for example, one or more of washing, slurrying, centrifugation, filtration, distillation, decantation, evaporation and treatment with ion exchange beads. Additionally or alternatively, the pattern treatment composition can be purified, for example, by filtration and/or treatment with ion exchange beads. Through purification of the polymer and/or pattern treatment composition, metal impurity levels of 10 ppb or less can be achieved.

The pattern treatment composition layer 108 is typically next baked to remove solvent from the composition. This bake or an additional bake can be used to induce bonding between the reactive surface attachment group of the polymer and the hardmask material layer. The need for bake-induced bonding will depend, for example, on the particular materials of the reactive attachment group and hardmask layer and the type of bond being formed. A typical bake for the pattern treatment composition is conducted at a temperature of from about 100 to 350° C., and a time of from about 30 to 300 seconds.

Residual pattern treatment polymer that is not bonded to the hardmask material layer is next removed from the substrate by rinsing with a rinsing agent comprising a solvent. The rinse leaves behind a layer 108' of the polymer that is bonded to the hardmask layer as shown in FIG. 2D. The bound polymer typically forms a monolayer over the hardmask layer. Without wishing to be bound by any particular theory, it is believed that due to the flexible nature of the polymer chains and the interfacial tension with air, the bound polymers tend to minimize their respective surface areas thereby forming round holes. Layer 108' typically has a thickness of from 2 to 25 nm, for example, from 5 to 15 nm. The residual, unbound polymer is typically the same polymer (unaltered chemically) as present in the original pattern treatment composition, as opposed to a polymer that has been altered chemically after coating, for example, as a result of chain scission following exposure to activating radiation such as UV radiation. The methods are free of exposing the pattern treatment polymer to activating radiation, for example, UV radiation, that can chemically alter the polymer.

Suitable rinsing agents include solvents in which the residual, unbound polymer is soluble and in which the polymer layer 108' is insoluble. Suitable solvents for the rinsing agent can include, for example, organic solvents, aqueous solvents and combinations thereof, for example, those described above with respect to the pattern treatment compositions. Suitable organic solvents include, for example, those chosen from alcohols, ketones, esters, ethers, hydrocarbons, and mixtures thereof. Suitable alcohol solvents include, for example, alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Of these, propylene glycol monomethyl ether acetate and butyl acetate are preferred. Suitable aqueous solvents include, for example, water and quaternary ammonium hydroxide solutions, for example, tetramethylammonium hydroxide (TMAH) solutions. It may be desirable to use the same solvent used in the pattern treatment composition. The solvent component is typically present in the rinsing agents in a combined amount of from 90 wt % to 100 wt %, more typically greater than 95 wt %, greater than 98 wt %, greater than 99 wt % or 100 wt %, based on the total weight of the rinsing agent.

The rinsing agent may include optional additives, for example, one or more surfactants such as described above. Such optional additives typically will be present in minor concentrations, for example, in amounts of from about 0.01 to 5 wt % based on the total weight of the sensing solvent.

The rinsing agent can be applied to the substrate by known techniques, for example, by spin-coating. The rinsing time is for a period effective to remove the un-bonded polymer, with a time of from 15 to 120 seconds being typical. The rinse is typically conducted at room temperature. Optionally, a post-rinse bake can be conducted for one or more of removing residual rinse solvent, inducing relaxation of the polymer chains and densification of the polymer layer, and improving circularity of the holes. The post-rinse bake, if used, is typically conducted at a temperature of from about 90 to 130° C. and a time of from about 30 to 120 seconds.

With removal of the residual polymer, holes 110 are formed in the substrate surface at positions surrounded by respective posts. In the case of the illustrated square post array of FIG. 2, a single hole 110 is present at the center of and equidistant from each of the four surrounding neighboring coated posts. The post pattern dimensions, post pitch and hardmask and polymer layer thicknesses should be chosen such that, at a minimum, adjacent coated post patterns after residual polymer removal are in contact with each other.

Figure 2E:
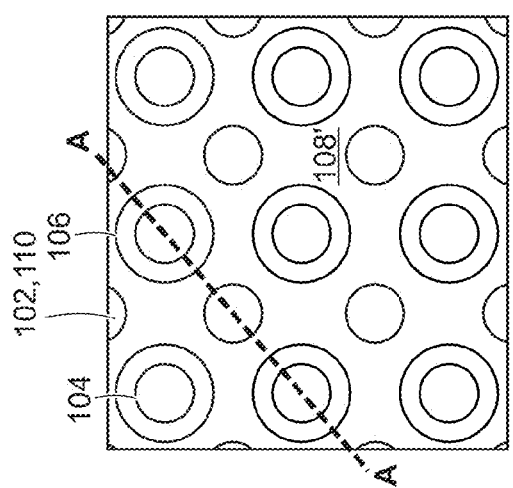
Figure 2E:
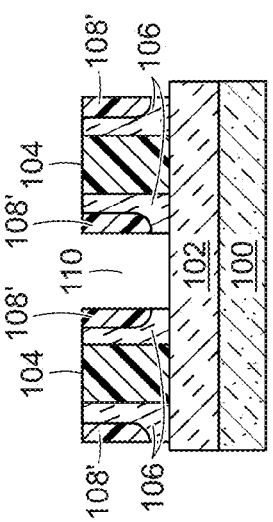
Figure 2D:
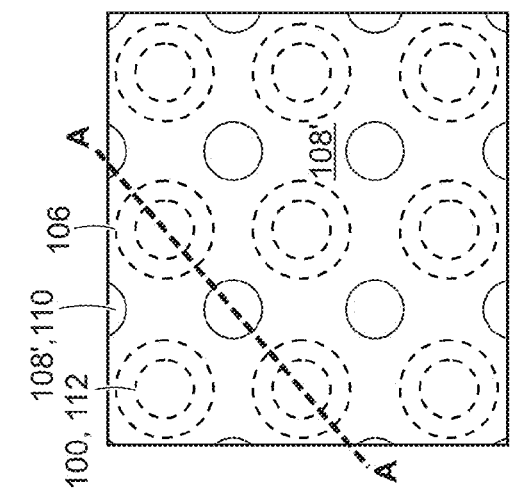
Figure 2D:
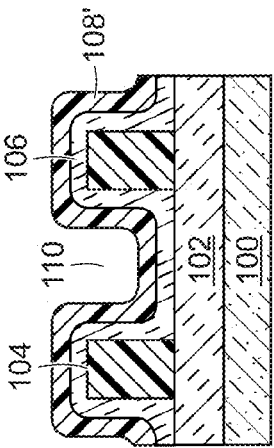

As shown in FIG. 2E, the polymer layer 108' and hardmask layer 106 are next etched to expose layer 102 at the bottom of holes 110 while also exposing the top surface of the post patterns 104. Etching of the polymer layer 108' and hardmask layer 106 is typically conducted by anisotropic dry-etching, with the etch chemistries being dependent on the particular materials making up the layers. Typically, the etching is conducted in two separate steps, first removing regions of the polymer layer and then regions of the hardmask layer to form holes 110. Suitable materials and processes for removing the polymer and hardmask layer regions are known in the art.

As depicted in FIG. 2F, the post patterns 104 are next removed to form holes 112, thereby exposing layer 102 in the regions previously covered by the post patterns. The post patterns are typically removed by selective dry etching. Suitable processes for removing the post patterns are known in the art. For example, oxygen plasma ashing can be used to remove post patterns formed from an organic material. This leaves an etch mask comprising patterns formed from the remaining portions of the hardmask layer 106 and polymer layer 108'.

The one or more underlying layer 102 can next be selectively etched to transfer the pattern of the etch mask, thereby exposing the underlying substrate 100 as shown in FIG. 2G. Suitable etching techniques and chemistries for etching layer 102 are known in the art, with dry-etching processes such as reactive ion etching being typical. The remaining hardmask layer 106 and polymer layer 108' can next be removed from the substrate using known etching or stripping techniques. Further processing, for example, one or more of coating, etching and photolithographic processes, are conducted on the substrate to form a finished device.

FIG. 3A-H illustrates a further exemplary process flow for forming a photolithographic pattern in accordance with the invention. The description set forth above with respect to FIG. 2A-H is applicable to FIG. 3A-H, with differences described below. FIG. 3A depicts a hexagonal array of post patterns, wherein each interior post 104 is surrounded equidistantly by six neighboring posts, the neighboring posts forming a hexagonal pattern. In this process scheme, two holes 110 (FIG. 3D) are formed between and in line with every other post along the perimeter of each hexagon. In other words, a single depression 109 corresponding to a hole 110 is formed at the center of each equilateral triangle formed by the center post and any two adjacent posts along the perimeter of the hexagon.

The following non-limiting examples are illustrative of the invention.

EXAMPLES

Pattern Treatment Polymers

Pattern Treatment Polymer-1 (PTP-1)

0.025 g copper bromide (CuBr), 0.070 g tris[2-(dimethylamino)ethyl]amine and 2 mL anisole were disposed in a sealed sample vial and purged with nitrogen for 15 minutes. In another vial, 0.070 g tin(II) 2-ethylhexanoate was dissolved in 2 mL of anisole and purged with nitrogen. 180.0 g styrene, 0.365 g 2-hydroxyethyl 2-bromo-2-methylpropanoate and 180 mL anisole were added into a 500 mL round bottom flask and purged for 30 minutes with nitrogen. The solutions in the two vials were syringed out and mixed with the contents of and in the 500 mL round bottom flask. The mixture was then reacted by heating with an oil bath for 20 hours at 110° C. After the reaction, the resulting polymer was precipitated from methanol, air-dried overnight, re-dissolved in THF with an ion-exchange resin (Dow Amberlite™ IRC 7481) and re-precipitated from methanol. The final polymer PTP-1 was filtered, air-dried overnight and further dried under vacuum at 50° C. overnight. [PTP-1: Mn=25.5 k; PDI=1.19].

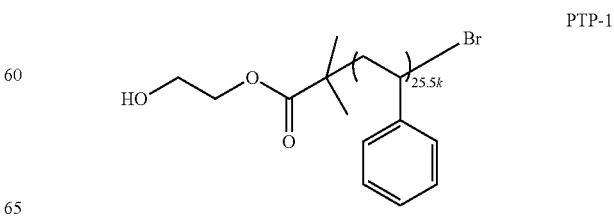

Pattern Treatment Polymer-2 (PTP-2)

Hydroxy-terminated poly(2-vinylpyridine) (OH-P2VP) (Polymer Source Inc.) prepared by living anionic polymerization of 2-vinyl pyridine in THF [PTP-2: Mn=13.0 k; PDI=1.10].

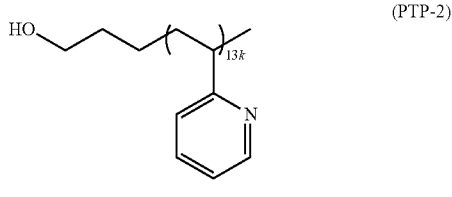

(PTP-2)

Pattern Treatment Polymer-3 (PTP-3)

Poly(styrene-b-2-vinyl pyridine) (PS-b-P2VP) (Polymer Source Inc.) [PTP-3: Mn of polystyrene block=56 k; Mn of poly(2-vinlypyridine) block=21 k; PDI=1.06].

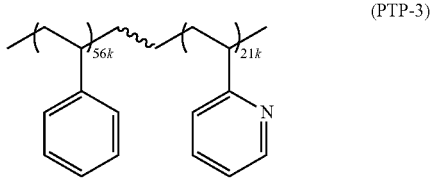

(PTP-3)

Pattern Treatment Polymer-4 (PSP-4)

Poly(1,1,1,2,2-pentamethyl-2-(4-vinylphenyl)disilane-block-Polydimethylaminoethylmethacrylate (PPMDSS-b-PDMAEMA) was synthesized using anionic polymerization. 1,1,1,2,2-pentamethyl-2-(4-vinylphenyl)disilane (PMDSS), dimethylaminoethyl methacrylate (DMAEMA) and THF were freeze-pump-thawed three times to remove oxygen. The monomers were further purified prior to use with activated $Al_2O_3$ and were diluted with cyclohexane to about 50 vol % concentration. 44.45 g THF (amount required for a reaction concentration of about 7-10 wt % solids) was transferred to a reactor containing 0.04 g pre-dried LiCl. The contents were cooled to −78° C. in a dry ice/isopropanol bath. The THF was titrated with sec-butyl lithium (SBL) initiator in 0.7M cyclohexane until a green color was observed. The reaction bath was warmed to room temperature until the green color fully disappeared. The reaction bath was again cooled to −78° C. followed by addition of 0.03 g diphenyl ethylene (DPE) and 0.107 g SBL initiator to yield a bright red color. 4.36 g PMDSS monomer was fed to the reactor and the contents were stirred for an additional four hours. A reaction aliquot was collected by cannulating the polymer mixture in oxygen-free methanol. The precipitated polymer was analyzed by GPC for Mn. 0.64 g DMAEMA monomer was added to the reactor and the mixture was stirred for two hours at −78° C. The reaction was then quenched by addition of oxygen-free methanol. The reaction product was precipitated out in methanol to yield a powdery white precipitate which was vacuum-dried in an oven at 50° C. for eight hours to yield a dry polymer. [PTP-4: Mn PPMDSS-b-PDMAEMA=33.6 k-b-5 k; PDI=1.12].

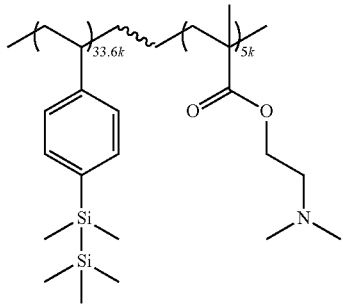

(PTP-4)

Pattern Treatment Composition Preparation

Pattern Treatment Composition 1 (PTC-1):
0.3 g pattern treatment polymer PTP-1 was dissolved in 14.7 g propylene glycol methyl ether acetate (PGMEA) to form a 2.0 wt % solution. The solution was filtered through a Teflon filter having a 0.2 micron pore size.

Pattern Treatment Composition 2 (PTC-2):
0.3 g pattern treatment polymer PTP-2 was dissolved in 14.7 g PGMEA to form a 2.0 wt % solution. The solution was filtered through a Teflon filter having a 0.2 micron pore size.

Pattern Treatment Composition 3 (PTC-3):
0.6 g pattern treatment polymer PTP-3 was dissolved in 19.4 g 2-heptanone to form a 3.0 wt % solution. The solution was filtered through a Teflon filter having a 0.2 micron pore size.

Pattern Treatment Composition 4 (PTC-4):
0.6 g pattern treatment polymer PTP-4 was dissolved in 19.4 g n-butylacetate (NBA) to form a 3.0 wt % solution. The solution was filtered through a Teflon filter having a 0.2 micron pore size.

Wafer Patterning I

Twelve-inch silicon wafers having a multilayer stack of 50 Å silicon oxide/1000 Å silicon nitride//100 nm organic dielectric (Shin-Etsu ODL-102)/350 Å silicon-containing antireflective coating (SiARC) (Shin-Etsu SHB-A940)/1050 Å positive-type photoresist (TOK Pi6). The photoresist layer was exposed using a TEL 1950Hi/Lithius Pro scanner with a numerical aperture (NA) of 1.35 and MP4 20-45 GEN2 illumination through a reticle including first circular post patterns having a diameter of 56 nm and a pitch of 100 nm and second circular post patterns having a diameter of 58 nm and a pitch of 100 nm at various doses across each wafer. A post-exposure bake was performed at 90° C. for 60 seconds, and the photoresist layer was developed using 0.261 N TMAH developer to form post patterns with a pitch of 100 nm and various critical dimensions (CDs) across the wafers. Pattern transfer was performed by etching the SiARC layer and then the organic dielectric layer (ODL), followed by the silicon nitride layer. An in situ ash was then conducted to remove the remaining photoresist, SiARC and ODL material. 12 nm of silicon nitride was then deposited over the post patterns using a TEL TELINDY™ IRad™ Plasma Enhanced CVD Reactor.

Pattern treatment compositions were spin-coated on the post-patterned wafers at 1500 rpm for 40 seconds using a Laurell spin-coater. The coated wafers were annealed on a hot plate under nitrogen at 250° C. for 2 minute. Residual, ungrafted polymer from the pattern treatment compositions was removed by rinsing with propylene glycol methyl ether acetate (PGMEA) or n-butyl acetate (NBA), as described in Table 1.

TABLE 1

| Example | Pattern Treatment Composition | Rinse Solvent |
|---------|-------------------------------|---------------|
| 1 | PTC-1 | PGMEA |
| 2 | PTC-2 | PGMEA |
| 3 | PTC-3 | PGMEA |
| 4 | PTC-4 | NBA |

Top-down scanning electron microscope (SEM) images were recorded by a Hitachi CG4000 SEM (Hitachi Co., Japan) operating at 0.2 to 2 kV accelerating voltage and 250,000 magnification. FIG. 4 depicts resulting SEM images of patterns after coating the silicon nitride layer over the resist post patterns and before application of a pattern treatment composition, and patterns after application of the pattern treatment compositions and solvent rinse. As can be seen from the images, circular or substantially circular contact hole patterns resulted.

Wafer Patterning II

The wafers as processed above are further processed to generate contact hole patterns for etching an underlying layer. The grafted polymer from the pattern treatment composition and underlying SiN are anisotropically dry-etched to expose the tops of the post patterns and to expose the SiARC layer at the bottom of the generated contact holes. The post resist material is removed by oxygen ashing to expose the underlying SiARC layer to provide patterns for forming contact holes.

What is claimed is:

1. A contact hole formation method, comprising:
   (a) providing a substrate comprising a plurality of post patterns over a layer to be patterned;
   (b) forming a hardmask layer over the post patterns and the layer to be patterned;
   (c) coating a pattern treatment composition over the hardmask layer, wherein the pattern treatment composition comprises a polymer comprising a reactive surface attachment group and a solvent; and optionally baking the substrate;
   wherein the polymer becomes bonded to the hardmask layer to form a polymer layer over the hardmask layer; and
   (d) treating the substrate with a rinsing agent comprising a solvent to remove residual, unbound said polymer, thereby forming a first hole disposed between a plurality of surrounding post patterns;
   wherein the method is free of exposing the polymer to activating radiation from coating the pattern treatment composition to treating the substrate with the solvent.

2. The method of claim 1, wherein the post patterns comprise an organic material.

3. The method of claim 1, wherein the hardmask material is a silicon oxide, a silicon nitride or a silicon oxynitride.

4. The method of claim 1, wherein the polymer is covalently bonded to the hardmask material.

5. The method of claim 1, wherein the polymer is hydrogen bonded to the hardmask material.

6. The method of claim 1, wherein the polymer is an organosilicon polymer.

7. The method of claim 1, wherein the polymer is an organic polymer.

8. The method of claim 1, wherein the reactive surface attachment group is chosen from one or more of hydroxyl, sulfhydryl, carboxyl, epoxide, amine, amide, imine, diazine, diazole, optionally substituted pyridine, pyridinium and optionally substituted pyrrolidone groups.

9. The method of claim 1, further comprising baking the substrate after coating the pattern treatment composition and before treating the substrate with the solvent.

10. The method of claim 1, further comprising, after treating the substrate with the solvent, selectively removing the posts to form second holes and transferring a pattern of the first hole and the second holes to the substrate.

* * * * *